United States Patent
Meier et al.

(10) Patent No.: US 7,402,048 B2
(45) Date of Patent: Jul. 22, 2008

(54) TECHNIQUE FOR BLIND-MATING DAUGHTERCARD TO MAINBOARD

(75) Inventors: Pascal C. Meier, Sunnyvale, CA (US); Michael W. Leddige, Beaverton, OR (US); Mohiuddin Mazumder, San Jose, CA (US); Mark Trobough, Olympia, WA (US); Alok Tripathi, Beaverton, OR (US); Ven R. Holalkere, Lakewood, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/393,540

(22) Filed: Mar. 30, 2006

(65) Prior Publication Data

US 2007/0238322 A1    Oct. 11, 2007

(51) Int. Cl.
*H01R 12/00* (2006.01)
(52) U.S. Cl. .................................................. 439/65
(58) Field of Classification Search .................. 439/65, 439/637, 61, 591; 29/842–843, 876, 881, 29/884; 361/760, 777, 775, 785
See application file for complete search history.

(56) References Cited

U.S. PATENT DOCUMENTS

| | | | | |
|---|---|---|---|---|
| 4,245,876 A | * | 1/1981 | Ritchie et al. | 439/590 |
| 5,227,957 A | * | 7/1993 | Deters | 361/686 |
| 5,649,121 A | * | 7/1997 | Budman et al. | 710/301 |
| 5,784,644 A | * | 7/1998 | Larabell | 710/9 |
| 5,910,885 A | * | 6/1999 | Gulachenski et al. | 361/774 |
| 6,176,707 B1 | | 1/2001 | Neidich et al. | |
| 6,191,954 B1 | * | 2/2001 | Keidl et al. | 361/803 |
| 6,217,342 B1 | | 4/2001 | Neidich et al. | |
| 6,253,451 B1 | * | 7/2001 | Semmeling et al. | 29/842 |
| 6,717,275 B2 | * | 4/2004 | Matsuura et al. | 257/778 |
| 6,867,967 B2 | * | 3/2005 | Mok | 361/687 |
| 6,993,238 B2 | * | 1/2006 | Byers et al. | 385/135 |
| 7,014,472 B2 | * | 3/2006 | Fjelstad et al. | 439/65 |
| 7,027,307 B2 | * | 4/2006 | Kollipara et al. | 361/760 |
| 7,154,761 B1 | * | 12/2006 | Camerlo et al. | 361/788 |

* cited by examiner

*Primary Examiner*—Jean F Duverne
(74) *Attorney, Agent, or Firm*—Buckley, Maschoff & Talwalkar LLC

(57) ABSTRACT

An apparatus includes a printed circuit board (PCB) and a first flexible conductive cable ("flex cable") secured to the PCB. The apparatus also includes a daughter card having an end adjacent to the PCB and a second flex cable secured to the daughter card. The apparatus further includes a connector which provides an electrically conductive connection between the first flex cable and the second flex cable. The connector is positioned to sandwich a portion of the first flex cable between the connector and the PCB.

12 Claims, 8 Drawing Sheets

TECHNIQUE FOR BLIND-MATING DAUGHTERCARD TO MAINBOARD

BACKGROUND

Most printed circuit boards (PCBs) are constructed of a material like the well-known FR4 material, which has the advantage of being relatively economical to manufacture. FR4 is epoxy-based, with reinforcing glass fibers embedded in the epoxy.

One potential disadvantage of PCBs formed of FR4 is that such boards may not be suitable for implementation of high speed communication links that are expected to come into use in the near future. For example, for signaling in the 5 to 10 Gigabit per second (Gbs) range, or higher, the relatively high dielectric loss that would be occasioned by the FR4 material may make such signaling speeds impractical via traces on an FR4 PCB. It may be contemplated to construct PCBs of alternative materials that provide less dielectric loss, but such alternative materials tend to be quite expensive.

One of the present inventors, and another individual, have proposed that high-speed signaling paths be provided with flexible conductive cables (conventionally, and hereinafter, referred to as "flex cables"). Flex cables can be manufactured economically and of low-loss material. The present inventors now propose techniques to promote convenient assembly of electronic equipment in which flex cables are used to provide high-speed signaling paths.

DETAILED DESCRIPTION

Figure 1:
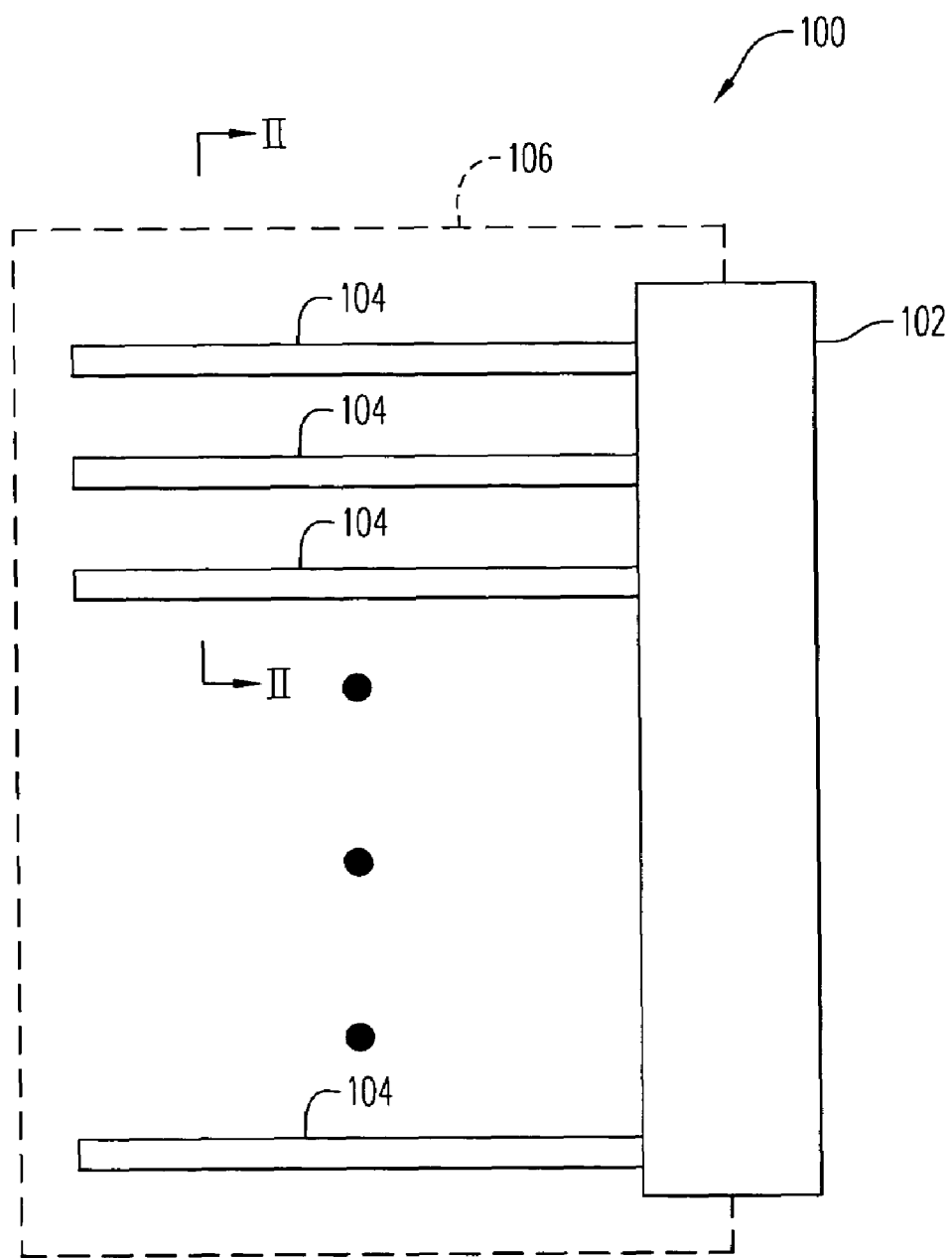
FIG. 1 is a schematic plan view of portions of an item of electronic equipment provided in accordance with some embodiments.

FIG. 1 is a schematic illustration of an item 100 of electronic, computing and/or telecommunications equipment provided according to some embodiments. For example, the electronic equipment 100 may be a server computer.

The item of equipment 100 includes a backplane or mainboard (which may also be referred to as a "motherboard") 102 having slots (not separately shown) in which blades or daughtercards 104 are installed. The backplane 102 may be at least partially formed as a conventional PCB. The backplane 102 and daughtercards 104 may be at least partially housed in a chassis, indicated in phantom by reference numeral 106. The number of daughtercards may be more or fewer than the four daughtercards that are explicitly shown.

Figure 2:
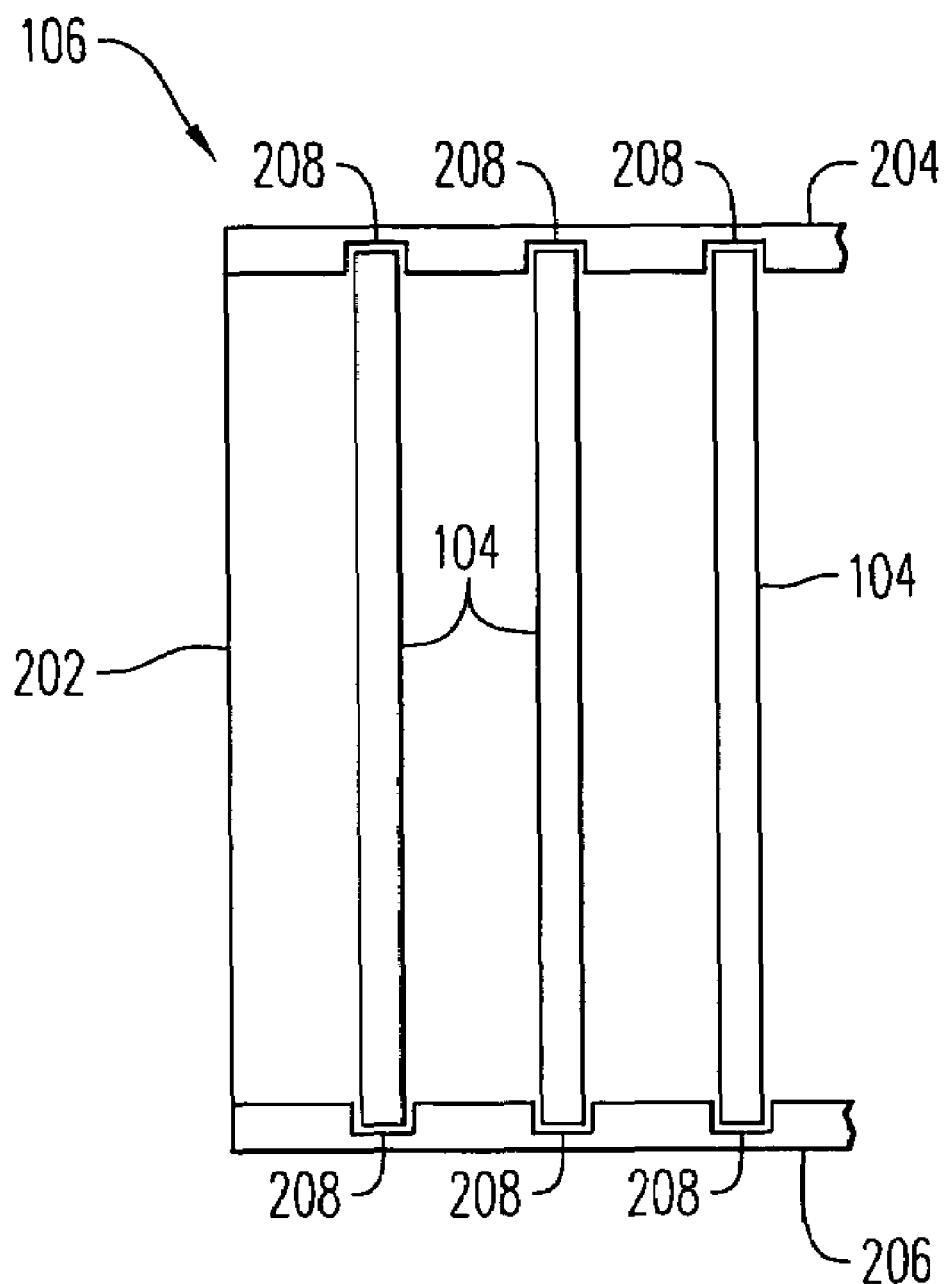
FIG. 2 is a schematic cross-sectional view taken at line II-II in FIG. 1.

FIG. 2 is a schematic cross-sectional view taken at line II-II in FIG. 1. As seen from FIG. 2, the chassis 106 includes a sidewall 202, a roof 204 and a floor 206. The roof 204 and floor 206 may have guide slots 208 formed therein. In assembling the equipment 100 it is possible to slide the daughtercards 104 in the guide slots 208 to guide the daughtercards 104 to their appropriate locations relative to the backplane 102 (FIG. 1, not shown in FIG. 2).

Figure 3:
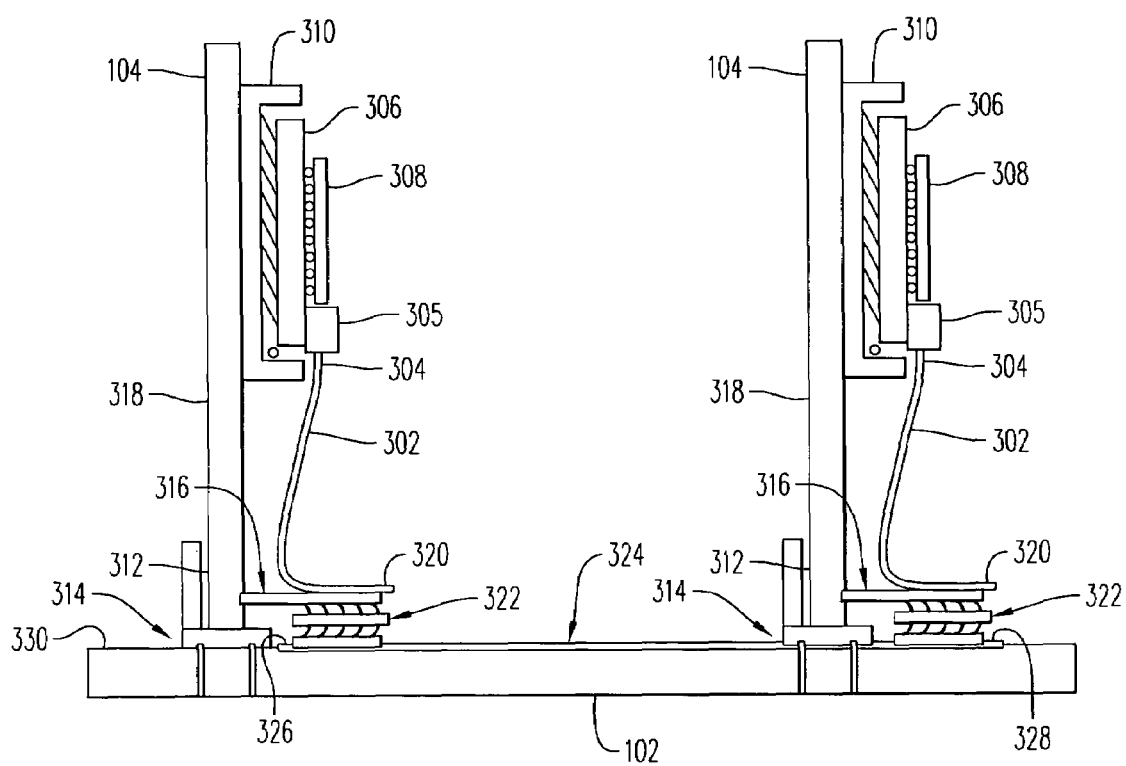
FIG. 3 is a schematic horizontal cross-sectional view of a portion of the electronic equipment of FIGS. 1 and 2.

As described up to this point, the electronic equipment 100 is arranged in a conventional manner. However, as seen in FIG. 3, the daughtercards 104 each have secured thereto a respective flex cable 302. Each flex cable 302 has an end 304 which is electronically coupled by a top-of-package connector 305 to a package/substrate 306 which houses/supports an integrated circuit (IC) such as a microprocessor 308. The package/substrate 306 is installed in a socket 310 mounted on the daughtercard 104.

Each daughtercard 104 has an end 312 which is adjacent the backplane 102 and which is received in a slot 314 (partially shown) on the backplane 102. Each daughtercard 104 also includes a support member 316 which extends at a right angle from the main body 318 of the daughtercard 104 at the end 312 of the daughter card 102. An opposite end 320 of the respective flex cable 302 is secured to the support member 316.

A connector 322 (e.g., a compressible connector) is secured (e.g., by soldering) to the support member 316 and in electrically conductive contact with the end 320 of the flex cable 302. In some embodiments, the connector 322 may be a so-called cLGA connector available from Amphenol InterCon Systems, Harrisburg, Pa.

The backplane 102 has secured thereto a flex cable 324. (For at least some purposes the flex cable 324 may be considered to be part of the backplane 102.) The connector 322 is in electrically conductive contact with an end 326 or 328 of the flex cable 324. Each connector 324 provides an electrically conductive connection between the respective flex cable 302 and the respective end 326 or 328 of the flex cable 324. Each connector 322 is positioned to sandwich a respective end 326 or 328 of the flex cable 324 between the connector 322 and the backplane 102. Consequently, a high-speed, low-loss signaling path between the respective microprocessors 308 is provided, at least in part, by the two flex cables 302 of the daughtercards 104, the connectors 322 and the flex cable 324 of the backplane 102. One or more low-speed connections (e.g., power connection(s)) may be made to the daughtercards 104 from the backplane 102 via the slots 314.

There will be noted as general, but not mandatory, characteristics of the arrangement shown in FIG. 3, that the daughtercards 104 extend at right angles from the backplane 102, and that the flex cable 324 is secured on a side 330 of the backplane 102 that faces the daughtercards 104.

Figure 4:
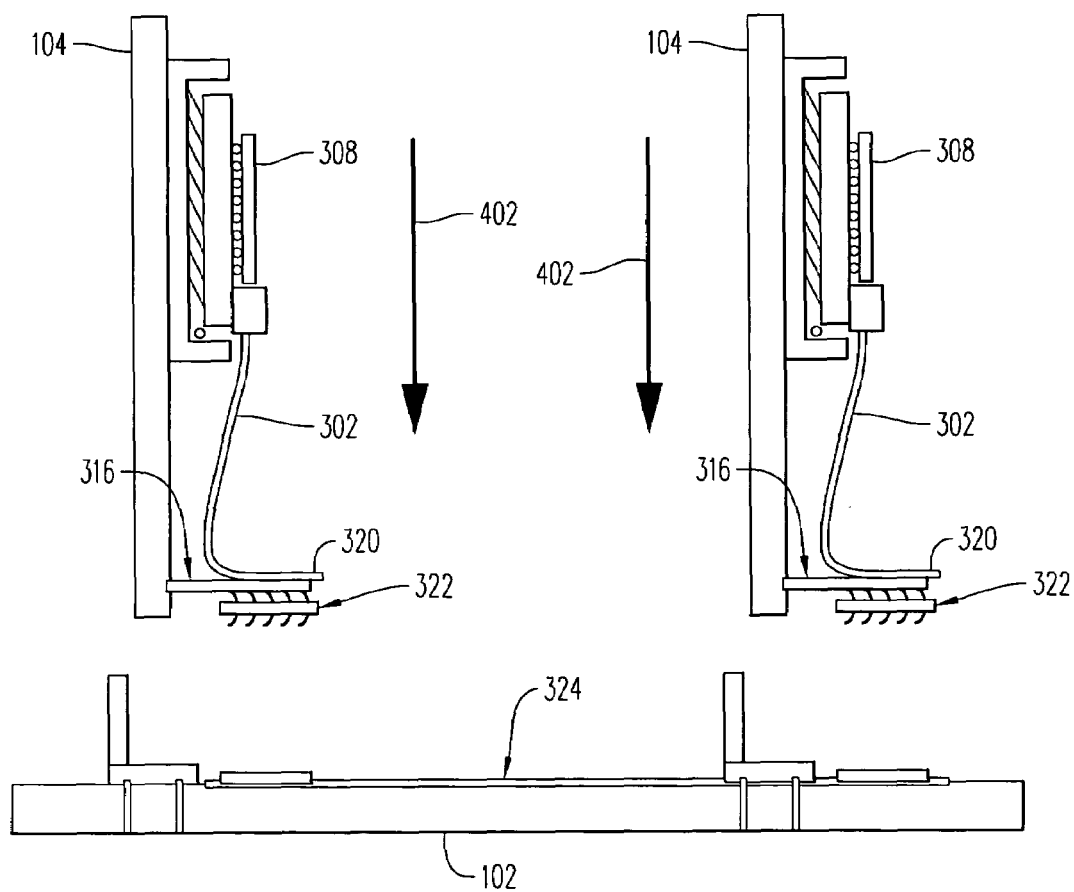
FIG. 4 schematically illustrates a technique for assembling the electronic equipment of FIGS. 1-3.

FIG. 4 schematically illustrates a technique for assembling the electronic equipment 100. The daughtercards 104 will be observed as having the respective connectors 322 electrically conductively coupled to the ends 320 of the flex cables 302 secured to the daughtercards 104. Each arrow 402 represents the activity of sliding one of the daughtercards 104 in guide slots 208 (FIG. 2, not shown in FIG. 4) to bring the flex cable 302 and the connector 322 into an electrically conductive connection with the backplane 102 and specifically with the flex cable 324 of the backplane 102. The respective connector 322 is secured to the daughtercard 104 and moves with the daughtercard as the daughtercard slides in the guide slots. It will be recognized that the two daughtercards 104 need not be brought into connection with the backplane 102 in simultaneous operations, but rather that one of the daughtercards may be connected to the backplane, and then the other daughtercard may be connected to the backplane. Moreover, the connection of the two daughtercards to the backplane serves, in the arrangement shown in FIG. 3, to connect the respective ICs 308 of the daughtercards 104 to each other for exchange of signals between the ICs via the signaling path of which the flex cables 302, the flex cable 324 and the connectors 322 form a part. The signaling path may support high speed signaling at, e.g., 5 or 10 Gbs or at still higher speed. It will be understood that if one daughtercard is brought into connection with the backplane (i.e., with the backplane's flex cable 324 at a time when the other daughtercard has already been connected with the backplane and its flex cable 324), then the bringing of the first daughtercard into connection with the backplane also brings the two flex cables 302 of the daughtercards into electrically conductive connection with each other.

Because each daughtercard 104 has the connector 322 coupled to the end 320 of the daughtercard's respective flex cable 302, the mating of the daughtercard to the backplane (by sliding the daughtercard toward the backplane) may be done in a "blind" manner, in the sense that the person assembling the equipment 100 need not either see or touch the point at which the daughtercard connects to the backplane. With this arrangement, flex cable to flex cable connection to and via the backplane may be made feasible and/or convenient, so that high speed signaling paths may be provided with flex cables in the equipment 100, without causing significant difficulties in assembling the equipment 100 and/or adding additional daughtercards thereto. Further, with the type of connector referred to herein, or with similar connectors, the physical length of the connection between the flex cables may be quite short, so that the impedance of the connector itself is very small and the possibility of signal reflections is minimized.

Figure 5:
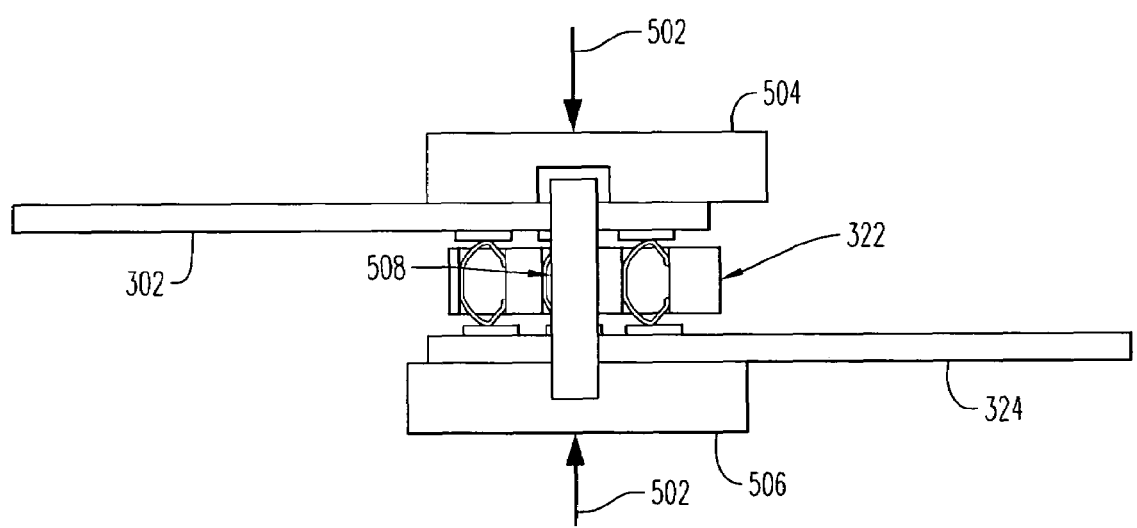
FIG. 5 is a schematic cross-sectional view showing a portion of a connector which provides an electronically conductive connection between two flex cables in the electronic equipment of FIGS. 1-3.

FIG. 5 is a schematic cross-sectional view showing a portion of the connector 322 when it is positioned to provide an electronically conductive connection between the flex cables 302, 324. In the particular example illustrated in FIG. 5, the connector 322 is of the cLGA type referred to above. It would be desirable with this type of connector to provide a compressive force (indicated by arrows 502) to assure proper mating of the connection between the flex cable 302, 324 via the connector 322. To provide a mechanical framework for application of the compressive force, force application plates 504, 506 may be provided respectively above and below the connector 322. Alignment pins (only one shown, indicated by reference numeral 508) may be provided to guide the force application plates 504, 506 into proper alignment with each other. It may be desirable that the framework provided by the force application plates be quite rigid, to aid in applying force evenly to the connector 322.

Figure 6:
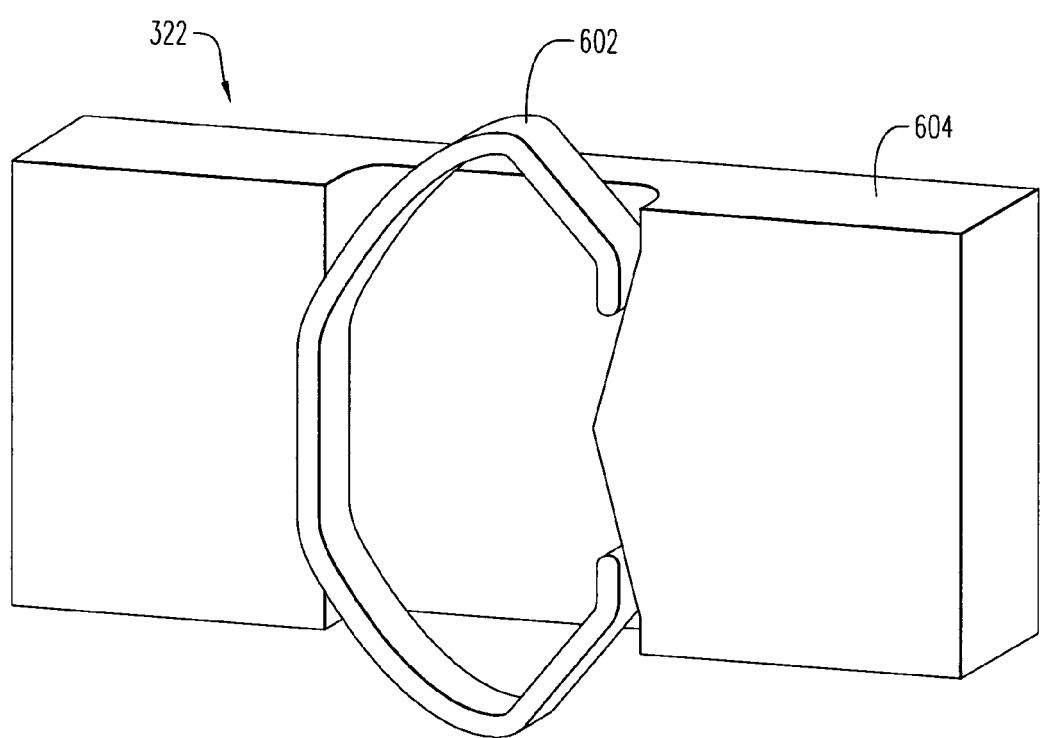
FIG. 6 is a close-up view of a portion of the connector shown in FIG. 5.

FIG. 6 is a close-up view of a portion of the connector 322. As seen from FIG. 6, the connector 322 includes C-shaped metal springs (only one shown in FIG. 6, indicated by reference numeral 602) to serve as the electrically conductive elements of the connector 322. The springs are held in a suitable manner in a support block 604 to allow the springs to be compressed to assure positive conductive contact between each branch of a spring and a respective conductive pad on one of the flex cables 302 or 324.

Since the connector 322 may include a considerable number of springs, a substantial compressive force may be desirable to assure reliability of the connection via the connector 322. A suitable mechanism to supply the substantial compressive force may include one or more screws, as in the example embodiment shown in FIG. 7.

Figure 7:
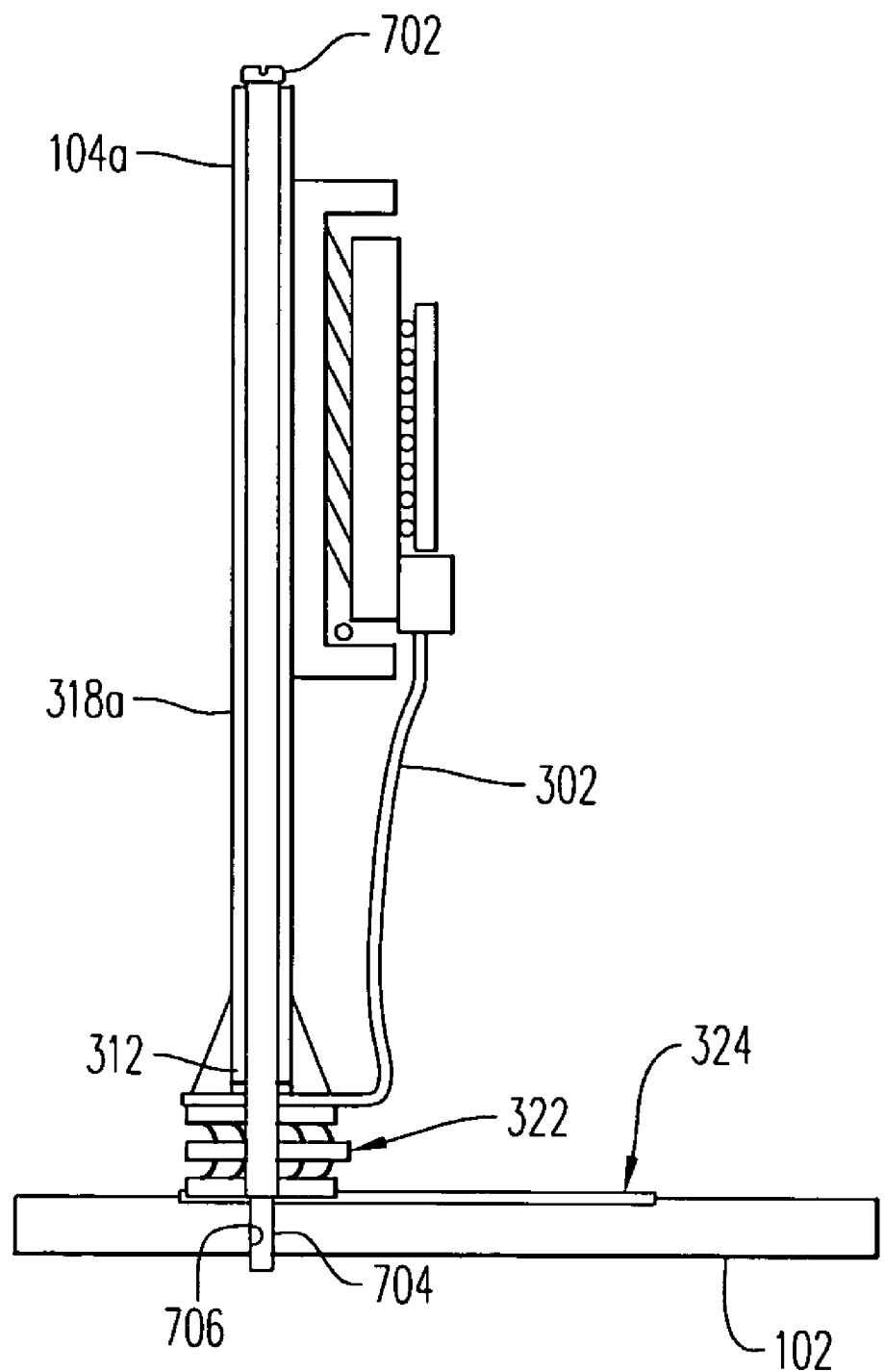
FIG. 7 is a schematic horizontal partial cross-sectional view of another embodiment of the electronic equipment of FIGS. 1-3.

FIG. 7 is a view similar to FIG. 3, but showing only one daughtercard 104a instead of the two daughtercards visible in FIG. 3. (In addition, in FIG. 7, only a portion of the flex cable 324 of the backplane 102 is shown.) Moreover, in the embodiment of FIG. 7, the connector 322 is directly at the end of the main body 318a of the daughtercard 104a and in alignment with the plane of the daughtercard 104a. To supply the compressive force to assure proper connection between the flex cable 302, 324, one or more screws 702 are provided. The screw 702 may have a longitudinal axis that coincides with the plane of the daughtercard so that the screw may extend through the entire length of the main body 318a of the daughtercard to have the tip 704 of the screw 702 threadedly engaged with a hole 706 in the backplane 102. A metal backing plate (not shown) or other reinforcement member may be provided below/behind backplane 102 to receive threads of the screws 702, to aid the screws 702 in holding the assembly together. It will be noted that the connector 322 is sandwiched between the backplane 102 and the end 312 of the daughtercard 104a.

Because of the alignment of the screw(s) 702, the main body 318 and the connector 322, the compressive force may be applied relatively evenly to the connector 322 to aid in obtaining reliable connection(s) between the flex cables 302, 324.

Figure 8:
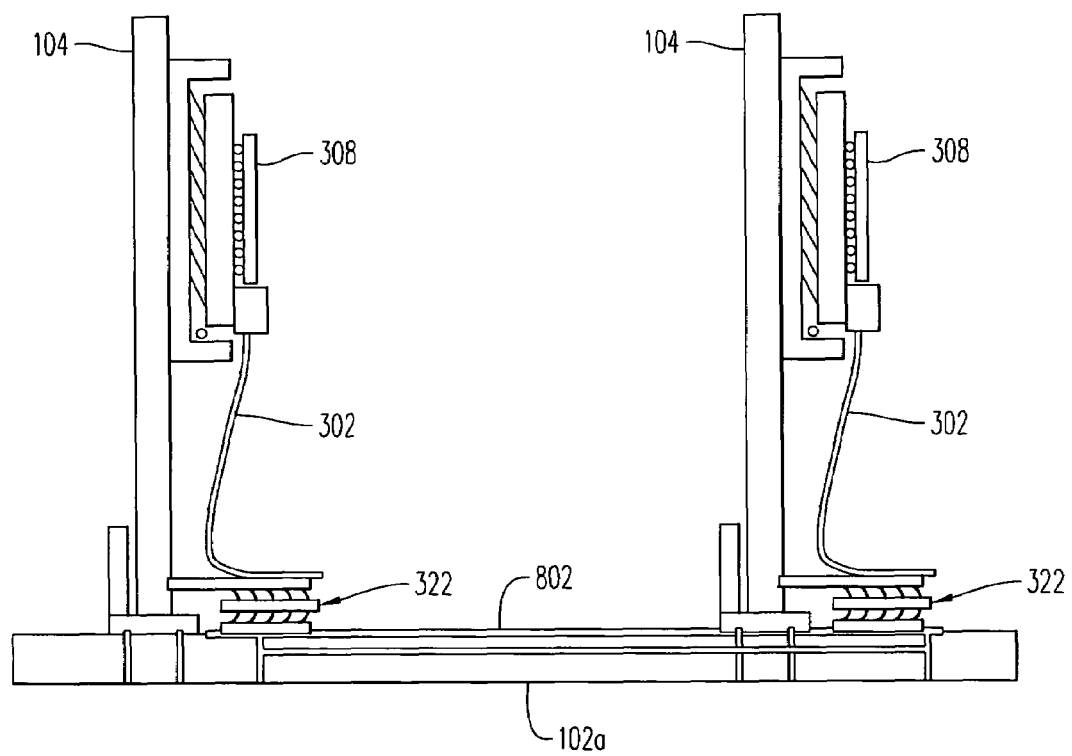
FIG. 8 is a view similar to FIG. 3, showing still another embodiment of the electronic equipment.

FIG. 8 is a view similar to FIG. 3, showing still another embodiment of the electronic equipment 100.

In the embodiment shown in FIG. 8, the backplane 102a does not have a flex cable secured thereto to provide a signal path between the flex cables 302 of the daughtercards 104. Rather, to allow for a suitable high-speed signal path via one or more signal traces 802 on the backplane 102a, the backplane may be constructed of a material that provides a lower dielectric loss than more commonly used materials such as FR4. For example, the materials known as Rogers 4350 or Isola 620 or Isola 640 may be employed for the backplane 102a in place of FR4. As in the embodiment of FIG. 3, connectors 322 are positioned to provide electrically conductive connections between the flex cables 302 of the daughtercards 104 and the backplane 102a. In this embodiment, the high speed signaling path between the ICs 308 is constituted, at least in part, by the flex cables 302, the connectors 322 and the trace(s) 802 on the backplane 102a.

As used herein and in the appended claims, a signal trace may be considered to be "on" a PCB whether the trace is on the surface of the PCB or is in an interior metallization layer of the PCB.

The daughtercards 104 shown in FIG. 8 are like the daughtercards 104 of FIG. 3, but one or more of the same may alternatively be replaced by a daughtercard 104a, as shown in FIG. 7, with the connector 322 directly aligned with the end of the daughtercard rather than supported on a support member 316 as in FIG. 3.

In another alternative embodiment, in at least some cases, the connector 322 may be secured (e.g., soldered) to the flex cable 324 or otherwise coupled to the backplane (e.g., permanently coupled to one or more signal traces and/or vias of the backplane) prior to installation of the corresponding daughter card, and hence is not carried by the daughtercard while the daughtercard is brought into connection with the backplane.

In other embodiments, one or more clips or other mechanical coupling arrangements may be employed instead of soldering the connector to the daughtercard or the backplane, as the case may be.

Among a number of different types of connectors that may be used in place of the above-mentioned cLGA connectors is the "MicroConn" connector available from Teledyne Interconnect Devices, San Diego, Calif. Alternatively, the connector does not need to use spring technology. Any technology that completes the electrical signaling path through mechanical compression can be used, e.g. For example, connectors using anisotropic conductive film may be employed, such as the "ACF" product created by the 3M Corporation.

The connection of the flex cable 302 to the IC 308 may be in any suitable manner and need not be accomplished in the manner illustrated in the drawings.

Although only one flex cable is shown on each daughtercard and on the backplane, in practice more than one flex cable may be provided on these components, at least in some instances.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus comprising:
   a printed circuit board (PCB);
   a first flexible conductive cable secured to the PCB;
   a first daughtercard having an end adjacent to the PCB;
   a second flexible conductive cable secured to the first daughtercard;
   a first connector which provides an electrically conductive connection between the first flexible conductive cable and the second flexible conductive cable, the first connector positioned to sandwich a portion of the first flexible conductive cable between the first connector and the PCB;
   a second daughtercard having an end adjacent the PCB;
   a third flexible conductive cable secured to the second daughter card; and
   a second connector which provides an electrically conductive connection between the first flexible conductive cable and the third flexible conductive cable;
   wherein the second connector is positioned to sandwich another portion of the first flexible conductive cable between the second connector and the PCB.

2. The apparatus of claim 1, further comprising a compression mechanism to apply a compressive force to the first connector.

3. The apparatus of claim 2, wherein the compression mechanism includes at least one screw.

4. The apparatus of claim 2, wherein the at least one screw has at least one longitudinal axis that coincides with a plane of the first daughtercard.

5. The apparatus of claim 4, wherein the first connector is sandwiched between the PCB and an end of the first daughtercard.

6. The apparatus of claim 1, further comprising:
   an integrated circuit mounted on the first daughtercard and electrically conductively connected to a first end of the second flexible conductive cable, the second flexible conductive cable having a second end in contact with the first connector.

7. The apparatus of claim 1, wherein the first connector is a cLGA connector.

8. The apparatus of claim 1, wherein the first daughtercard extends at a right angle from the PCB.

9. The apparatus of claim 1, wherein the PCB is a backplane.

10. The apparatus of claim 1, wherein the first flexible conductive cable is secured to a side of the PCB which faces the first daughtercard.

11. The apparatus of claim 1, wherein the first daughtercard includes a support member that extends at a right angle from a main body of the first daughtercard, the support member adjacent the PCB and supporting the first connector thereon.

12. The apparatus of claim 1, wherein the first connector is soldered to the second flexible conductive cable.

* * * * *